(12) United States Patent
Zang et al.

(10) Patent No.: US 10,825,913 B2
(45) Date of Patent: Nov. 3, 2020

(54) METHODS, APPARATUS, AND MANUFACTURING SYSTEM FOR FINFET DEVICES WITH REDUCED PARASITIC CAPACITANCE

(71) Applicant: GLOBALFOUNDRIES INC., Grand Cayman (KY)

(72) Inventors: Hui Zang, Guilderland, NY (US); Haiting Wang, Clifton Park, NY (US); Ruilong Xie, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/144,275

(22) Filed: Sep. 27, 2018

(65) Prior Publication Data

US 2020/0105905 A1 Apr. 2, 2020

(51) Int. Cl.
| | |
|---|---|
| *H01L 29/66* | (2006.01) |
| *H01L 29/78* | (2006.01) |
| *H01L 27/088* | (2006.01) |
| *H01L 27/02* | (2006.01) |
| *H01L 21/8234* | (2006.01) |

(52) U.S. Cl.
CPC ......... *H01L 29/66545* (2013.01); *H01L 21/823431* (2013.01); *H01L 27/0207* (2013.01); *H01L 27/0886* (2013.01); *H01L 29/66795* (2013.01); *H01L 29/785* (2013.01)

(58) Field of Classification Search
CPC .......... H01L 29/66795; H01L 27/0886; H01L 29/785; H01L 29/66545; H01L 21/823431; H01L 27/0207; H01L 21/823437; H01L 21/823481
See application file for complete search history.

(56) References Cited

U.S. PATENT DOCUMENTS

| | | | |
|---|---|---|---|
| 2014/0159123 A1* | 6/2014 | Cheng | H01L 29/78 257/288 |
| 2017/0365604 A1* | 12/2017 | Suh | H01L 27/0924 |
| 2018/0138092 A1* | 5/2018 | Lee | H01L 29/42364 |
| 2019/0067417 A1* | 2/2019 | Ching | H01L 21/823821 |
| 2019/0181137 A1* | 6/2019 | Lu | H01L 27/088 |

* cited by examiner

*Primary Examiner* — Bilkis Jahan
*Assistant Examiner* — Victor V Barzykin
(74) *Attorney, Agent, or Firm* — Williams Morgan, P.C.

(57) ABSTRACT

A method, apparatus, and manufacturing system are disclosed for a fin field effect transistor having a reduced parasitic capacitance between a gate and a source/drain contact. In one embodiment, we disclose a semiconductor device including first and second fins; an isolation structure between the fins; first and second metal gates; a first dielectric body under the first metal gate and on the substrate between the first fin and the second fin, wherein a top of the first dielectric body is below a top of the first metal gate; and a second dielectric body in the second metal gate and on the substrate between the first fin and the second fin, wherein a top of the second dielectric body is at or above a top of the second metal gate.

8 Claims, 12 Drawing Sheets

METHODS, APPARATUS, AND MANUFACTURING SYSTEM FOR FINFET DEVICES WITH REDUCED PARASITIC CAPACITANCE

BACKGROUND OF THE INVENTION

Field of the Invention

Generally, the present disclosure relates to the manufacture of sophisticated semiconductor devices, and, more specifically, to various methods for forming FinFET devices with reduced parasitic capacitance.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide semiconductor field effect transistors (MOSFETs or FETs) represent one significant type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by a voltage applied to the gate electrode. If a voltage that is less than a threshold voltage of the device is applied to the gate electrode, then there is substantially no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

In contrast to a planar FET, which has a flat structure, there are so-called 3D devices, which may be termed fin-FETs. More specifically, in such 3D devices, a generally vertically positioned, fin-shaped active area is formed and a gate electrode encloses both of the sides and the upper surface of the fin-shaped active area to produce a channel having a 3-dimensional structure instead of a planar structure. In some cases, an insulating cap layer, e.g., silicon nitride is positioned at the top of the fin-shaped active areas.

FinFET designs form "fins" on the surface of a semiconductor wafer using selective-etching processes. The fins may be used to form a raised channel between the source and drain of a transistor. The gate is then deposited such that it wraps around the fin. This 3-dimensional channel is relatively thin, and thus, the gate generally has significant control over the carriers within. However, in later processing steps, when S/D contacts are formed from the source or drain to a first conductive element overlying both the fin and the gate, the S/D contacts and the gate may be positioned so extremely close to one another that undesirable parasitic capacitance between the gate and the S/D contact may arise.

It would be desirable to form FinFET devices with reduced parasitic capacitance between gates and sources/drains.

SUMMARY OF THE INVENTION

The following presents a brief summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus, and manufacturing systems for FinFET devices with reduced parasitic capacitance between gates and source/drain contacts. In one embodiment, the present disclosure provides a semiconductor device, comprising a semiconductor substrate; a first fin and a second fin on the semiconductor substrate, wherein each fin has a long axis extending in a first horizontal direction; an isolation structure on the substrate between the first fin and the second fin; a first metal gate and a second metal gate on the substrate, the first fin, and the second fin, wherein each metal gate has a long axis extending in a second horizontal direction perpendicular to the first horizontal direction; a first dielectric body under the first metal gate and on the substrate between the first fin and the second fin, wherein a top of the first dielectric body is below a top of the first metal gate; and a second dielectric body in the second metal gate and on the substrate between the first fin and the second fin, wherein a top of the second dielectric body is at or above a top of the second metal gate.

In one embodiment, the present disclosure provides a method, comprising forming a semiconductor substrate; a first fin and a second fin on the semiconductor substrate, wherein each fin has a long axis extending in a first horizontal direction; an isolation structure on the substrate between the first fin and the second fin; a first replacement metal gate (RMG) and a second RMG on the substrate, the first fin, and the second fin, wherein each RMG has a long axis extending in a second horizontal direction perpendicular to the first horizontal direction; cutting a first gate cut in the first RMG and a second gate cut in the second RMG, wherein both gate cuts are to the isolation structure between the first fin and the second fin; filling the first gate cut and the second gate cut with a dielectric material; recessing the dielectric material in the first gate cut, to yield a first dielectric body and a second dielectric body, wherein a top of the first dielectric body is below a top of the first RMG; removing the first RMG and the second RMG; forming a first metal gate over the first dielectric body, wherein a top of the first metal gate is above the top of the first dielectric body; and forming a second metal gate adjacent to the second dielectric body, wherein a top of the second metal gate is at or below the top of the second dielectric body.

In one embodiment, the present disclosure provides a semiconductor device manufacturing system adapted to perform a method, such as is summarized above.

BRIEF DESCRIPTION OF THE DRAWINGS

The disclosure may be understood by reference to the following description taken in conjunction with the accompanying drawings, in which like reference numerals identify like elements, and in which.

Figure 1:
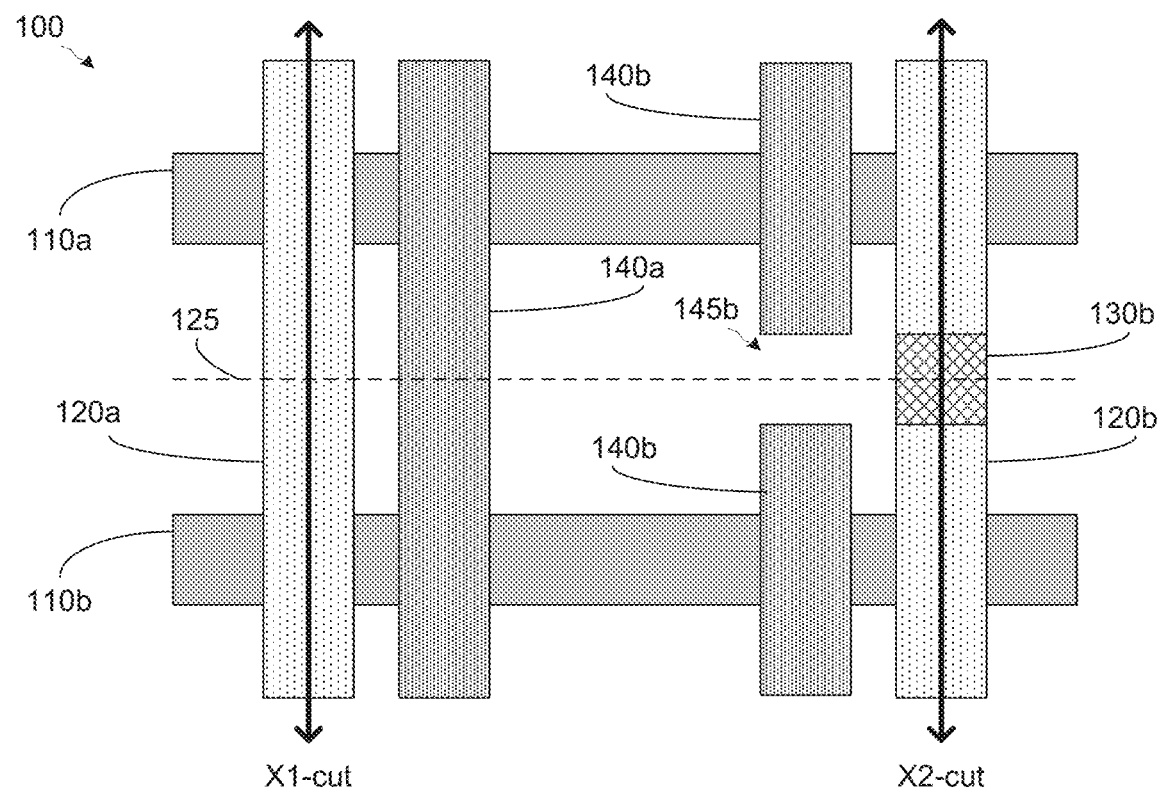
FIG. 1 illustrates a stylized plan depiction of portions of a semiconductor device, showing an X1 cut and an X2 cut, from each of which one or more cross-sectional depictions in subsequent figures may be shown.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Moreover, the stylized depictions illustrated in the drawings are not drawn to any absolute scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems, and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for forming fin field effect transistor (FinFET) devices with dielectric bodies disposed in at least a first gate. Such FinFET devices may have reduced risk of parasitic capacitance between gates and source/drain contacts.

FIG. 1 illustrates a stylized plan depiction of a semiconductor device 100 in accordance with embodiments herein. For brevity, the stylized plan view omits various structures that would be present in a final semiconductor device 100.

The semiconductor device 100 comprises, as seen from above, a first fin 110a and a second fin 110b. The fins 110a and 110b are disposed on a semiconductor substrate (omitted for brevity). Each fin 110a, 110b has a long axis extending in a first horizontal direction, i.e., from left to right in FIG. 1.

The semiconductor device 100 also comprises a first metal gate 120a and a second metal gate 120b. The gates 120a and 120b are disposed on the semiconductor substrate, on the first fin 110a, and on the second fin 110b. Each metal gate 120a, 120b has a long axis extending in a second horizontal direction perpendicular to the first horizontal direction, i.e., from top to bottom in FIG. 1.

The second metal gate 120b further comprises a second dielectric body 130b. The second dielectric body 130b has a top at or above a top of the second metal gate 120b. (A first dielectric body 130a, with a top below a top of the first metal gate 120a, is not visible in FIG. 1, but will be described in more detail below).

The semiconductor device 100 also comprises a first source/drain (S/D) contact 140a and a second S/D contact 140b. The S/D contacts 140a and 140b are disposed on the semiconductor substrate, on the first fin 110a, and on the second fin 110b. Specifically, and not shown under the S/D contacts 140a and 140b, each fin 110a, 110b comprises a S/D region, such as an epitaxial S/D region. Each S/D contact 140a, 140b has a long axis extending in the second horizontal direction. Each S/D contact 140a, 140b is in proximity to one of the gates 120a, 120b. As depicted, the second S/D contact 140b may contain a contact cut 145b. The contact cut 145b is substantially collinear with second dielectric body 130b along gate cut line 125. Also as depicted, the first S/D contact 140a lacks a cut along gate cut line 125. The lack of a cut would be expected to lead to parasitic capacitance between the first S/D contact 140a and the first gate 120a in prior art devices. The present disclosure reduces the risk of parasitic capacitance between the first S/D contact 140a and the first gate 120a, as will be described below.

For the sake of brevity, only two fins 110a and 110b, two metal gates 120a and 120b, and two S/D contacts 140a and 140b are shown in FIG. 1. In other embodiments, the semiconductor device 100 may comprise more than two fins, more than two gates, and/or more than two S/D contacts. Selecting a number of fins, a number of gates, and/or a number of S/D contacts will be a routine matter for the person of ordinary skill in the art having the benefit of the present disclosure.

Subsequent stylized cross-sectional depictions of the semiconductor device 100 according to embodiments herein will be taken along one of two cuts: an X1 cut (through and parallel to the long axis of the first metal gate 120a) or an X2 cut (through and parallel to the long axis of the second metal gate 120b).

FIGS. 2-18 illustrate stylized cross-sectional depictions of the semiconductor device 100 under various stage of manufacture, in accordance with embodiments herein.

Figure 2:
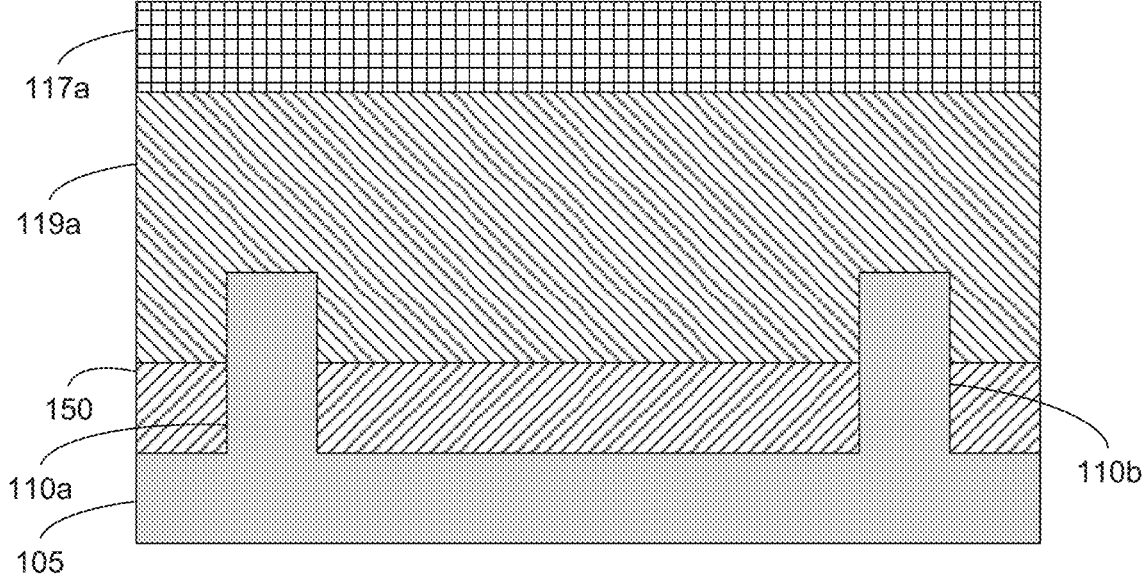
FIG. 2 illustrates a cross-sectional X1 cut view of a semiconductor device after a first stage of processing, in accordance with embodiments herein.
Figure 3:
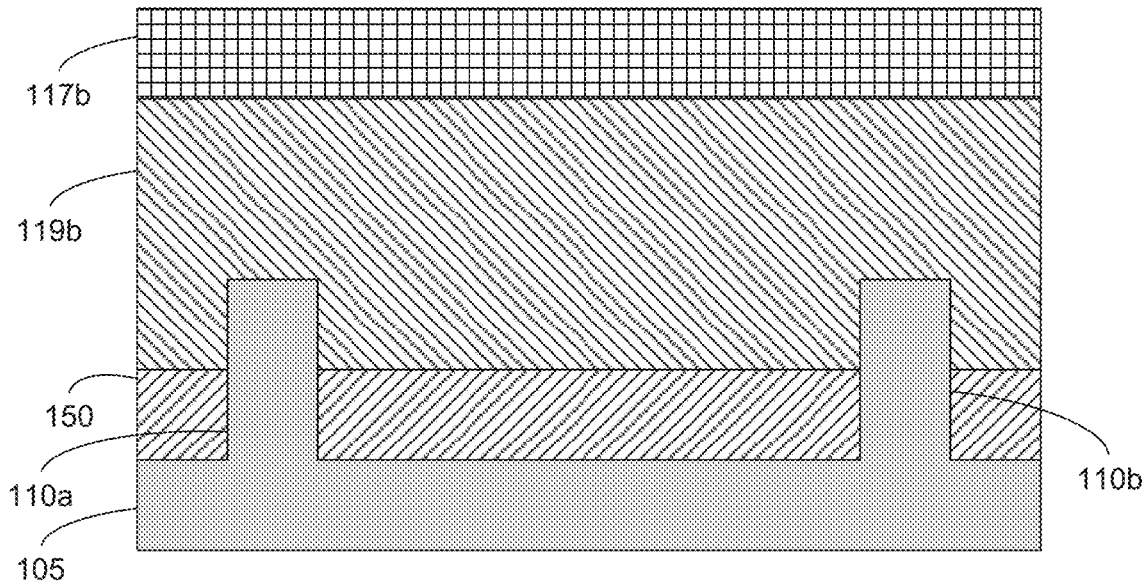
FIG. 3 illustrates a cross-sectional X2 cut view of a semiconductor device after a first stage of processing, in accordance with embodiments herein.

FIG. 2 illustrates a cross-sectional X1 cut view and FIG. 3 illustrates a cross-sectional X2 cut view of the semiconductor device 100 after a first stage of processing, in accordance with embodiments herein. In the first stage of processing is provided a semiconductor substrate 105. The semiconductor substrate 105 may comprise silicon, silicon-germanium, silicon-on-insulator (SOI), or other semiconductor materials known in the art.

Formed on the semiconductor substrate 105 are a first fin 110a and a second fin 110b. The fins 110a and 110b may comprise the same semiconductor material as the semiconductor substrate 105, but need not. In one embodiment, each fin 110a, 110b may comprise a plurality of semiconductor layers interleaved with a plurality of metal layers. The fins 110a and 110b may be formed by the person of ordinary skill in the art using any appropriate technique, which need not be described in detail.

In the first stage of manufacture, an isolation feature 150 is formed on the semiconductor substrate 105, including between the first fin 110a and the second fin 110b. The isolation feature 150 may be referred to herein as a shallow trench isolation (STI). The isolation feature 150 may comprise silicon oxide, a flowable oxide, TEOS, or any other material(s) that electrically isolate the first fin 110a from the second fin 110b. The isolation feature 150 may be formed using techniques known to the person of ordinary skill in the art.

The first stage of manufacture also includes the forming of a first dummy gate 119a and a second dummy gate 119b. The dummy gates 119a and 119b may be formed of any material and by any technique known in the art. For example, the dummy gates 119a and 119b may comprise poly. The dummy gates 119a and 119b may also be referred to herein as replacement metal gates (RMGs).

As shown, the dummy gates 119a and 119b have a top above a top of each fin 110a, 110b.

The first stage of manufacture may also include forming a first gate hard mask 117a and a second gate hard mask 117b over the first dummy gate 119a and the second dummy gate 119b, respectively. The gate hard masks 117a and 117b may comprise any appropriate material known to the person of ordinary skill in the art. When forming the gate hard masks 117a and 117b, a hard mask over one or more other features of the semiconductor device 100, such as over the second S/D contact 140b, may also be formed.

Figure 4:
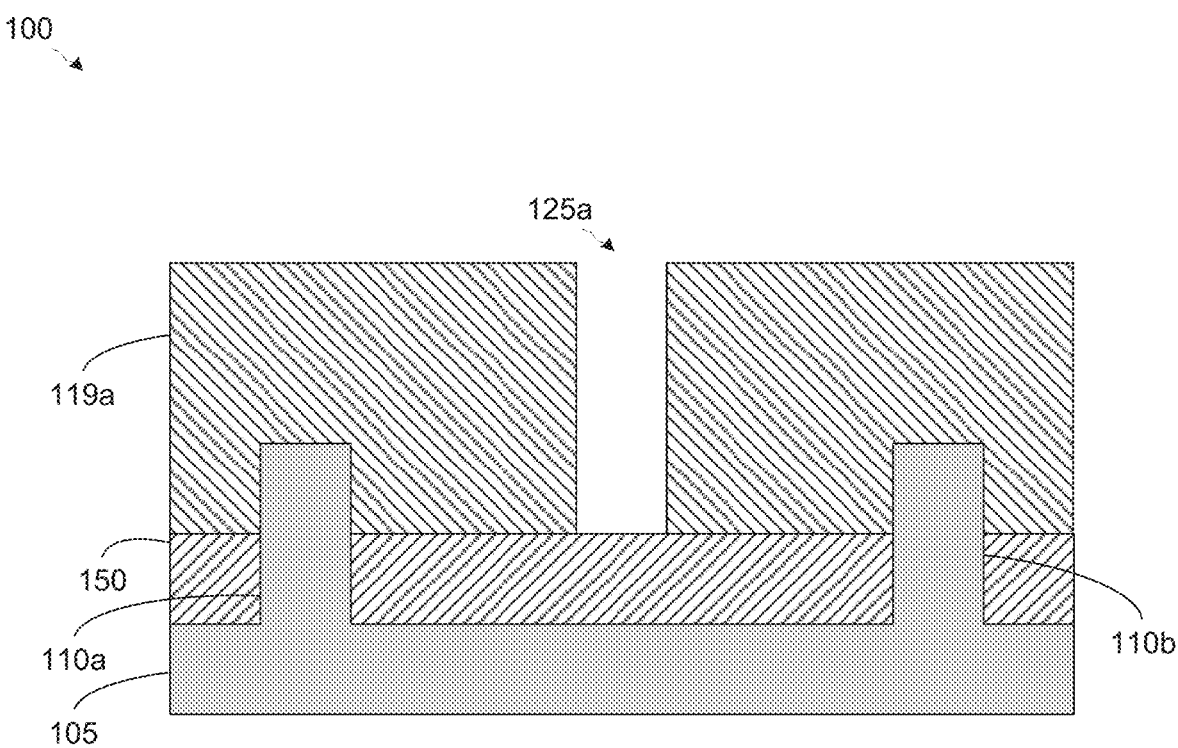
FIG. 4 illustrates a cross-sectional X1 cut view of a semiconductor device after a second stage of processing, in accordance with embodiments herein.
Figure 5:
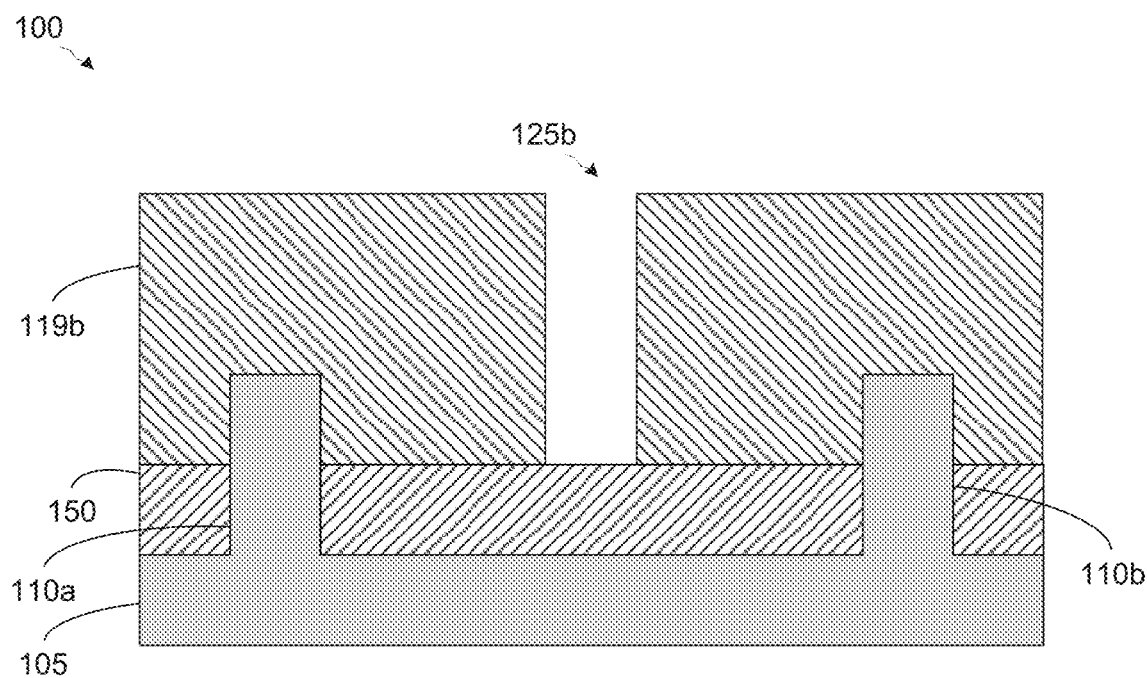
FIG. 5 illustrates a cross-sectional X2 cut view of a semiconductor device after a second stage of processing, in accordance with embodiments herein.

FIG. 4 illustrates a cross-sectional X1 cut view and FIG. 5 illustrates a cross-sectional X2 cut view of the semiconductor device 100 after a second stage of processing, in accordance with embodiments herein. In the second stage of processing, the gate hard masks 117a and 117b are patterned to expose portions of the dummy gates 119a and 119b. The second stage of processing also comprises etching the exposed portions of the dummy gates 119a and 119b, thereby yielding gate cuts 125a and 125b. (The patterning and etching may also form the cut 145b in the second S/D contact 140b shown in FIG. 1). Subsequently, the gate hard masks 117a and 117b (and any other hard masks present over the semiconductor device 100 after patterning and etching) may be removed. Patterning the gate hard masks 117a and 117b, etching the dummy gates 119a and 119b, and removing the gate hard masks 117a and 117b, may each be performed as a routine matter by the person of ordinary skill in the art.

As can be seen, the gate cuts 125a and 125b fully traverse the height of the dummy gates 119a and 119b, respectively.

Figure 6:
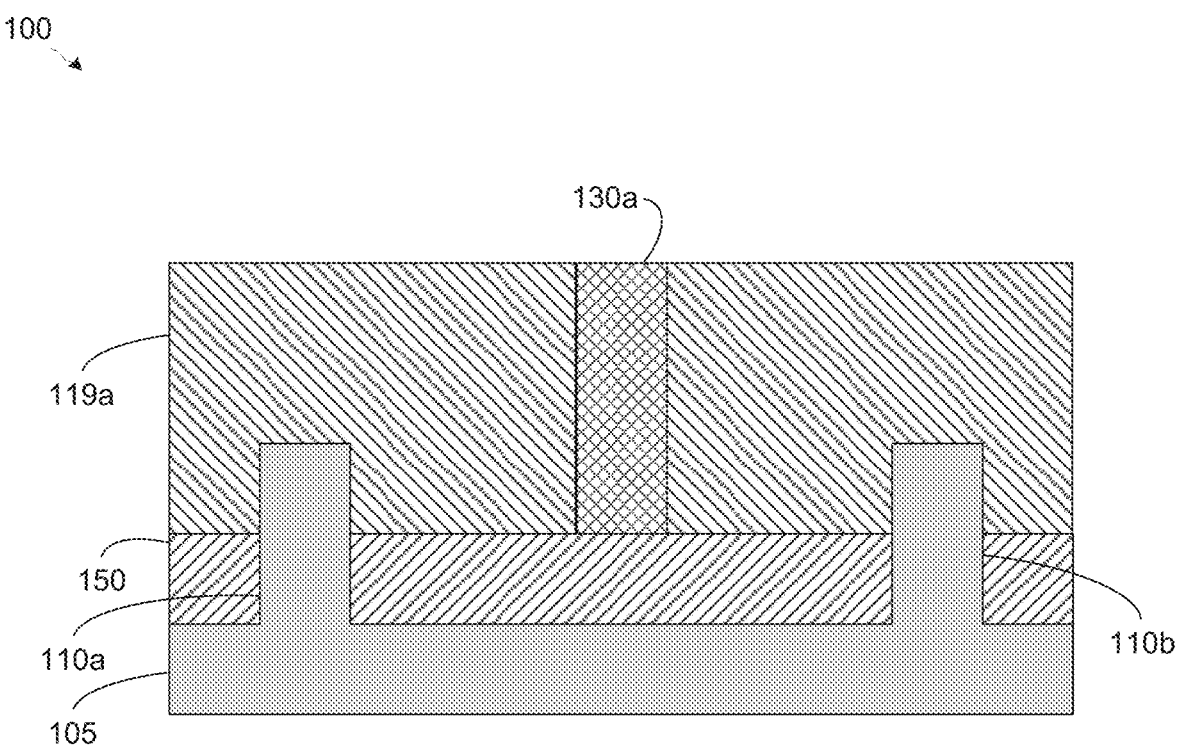
FIG. 6 illustrates a cross-sectional X1 cut view of a semiconductor device after a third stage of processing, in accordance with embodiments herein.
Figure 7:
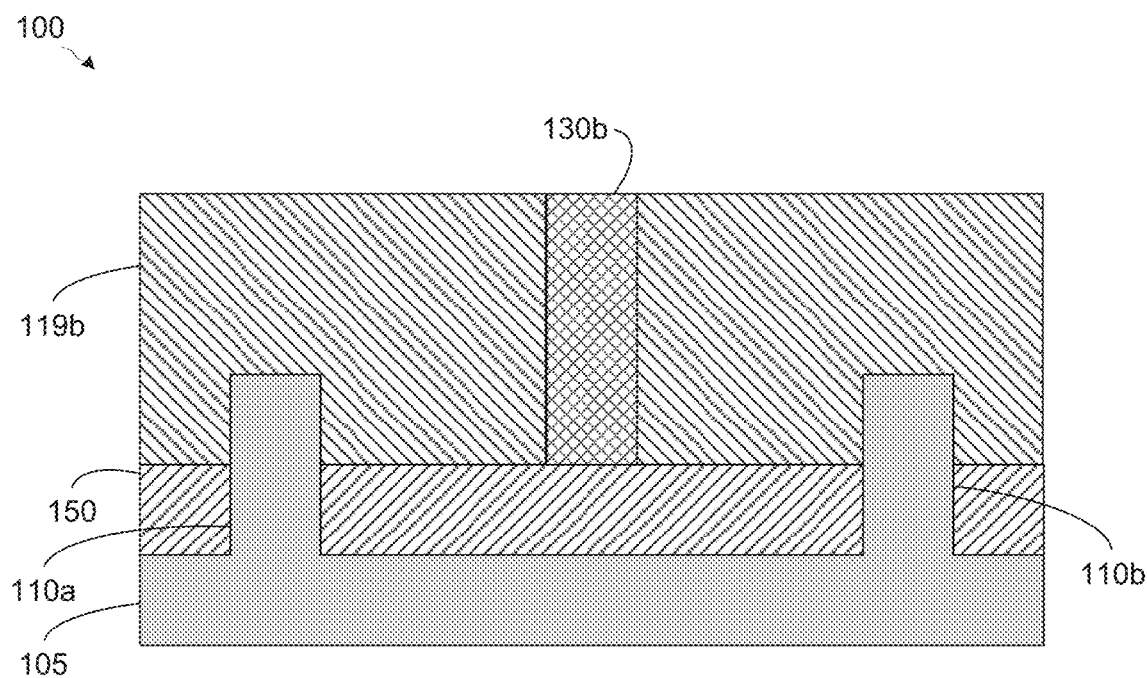
FIG. 7 illustrates a cross-sectional X2 cut view of a semiconductor device after a third stage of processing, in accordance with embodiments herein.

FIG. 6 illustrates a cross-sectional X1 cut view and FIG. 7 illustrates a cross-sectional X2 cut view of a semiconductor device after a third stage of processing, in accordance with embodiments herein. In the third stage of processing, the gate cuts 125a and 125b shown in FIGS. 4-5 are each filled with a dielectric material. Any dielectric material may be used, such as silicon nitride or silicon oxide, among others. In one embodiment, the dielectric material comprises silicon nitride. The third stage of processing yields a first dielectric body 130a in the first dummy gate 119a, and a second dielectric body 130b in second dummy gate 119b. The bottoms of the dielectric bodies 130a and 130b are in contact the isolation feature 150.

Figure 8:
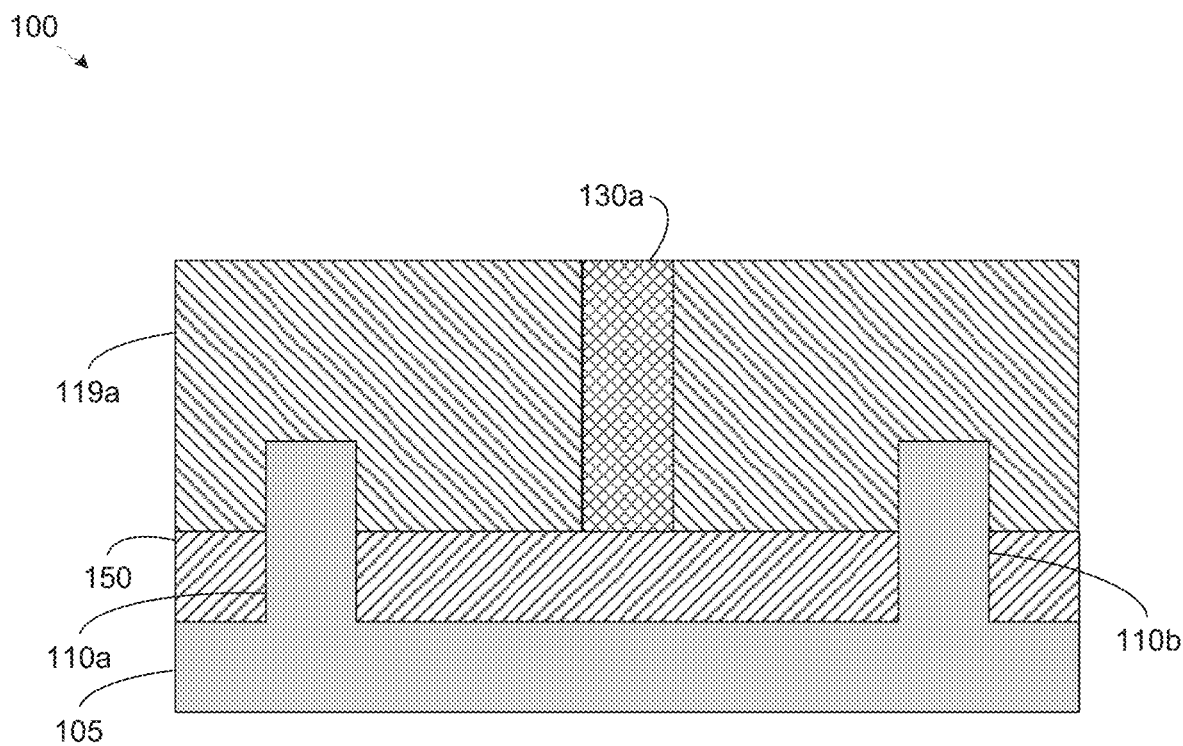
FIG. 8 illustrates a cross-sectional X1 cut view of a semiconductor device after a fourth stage of processing, in accordance with embodiments herein.
Figure 9:
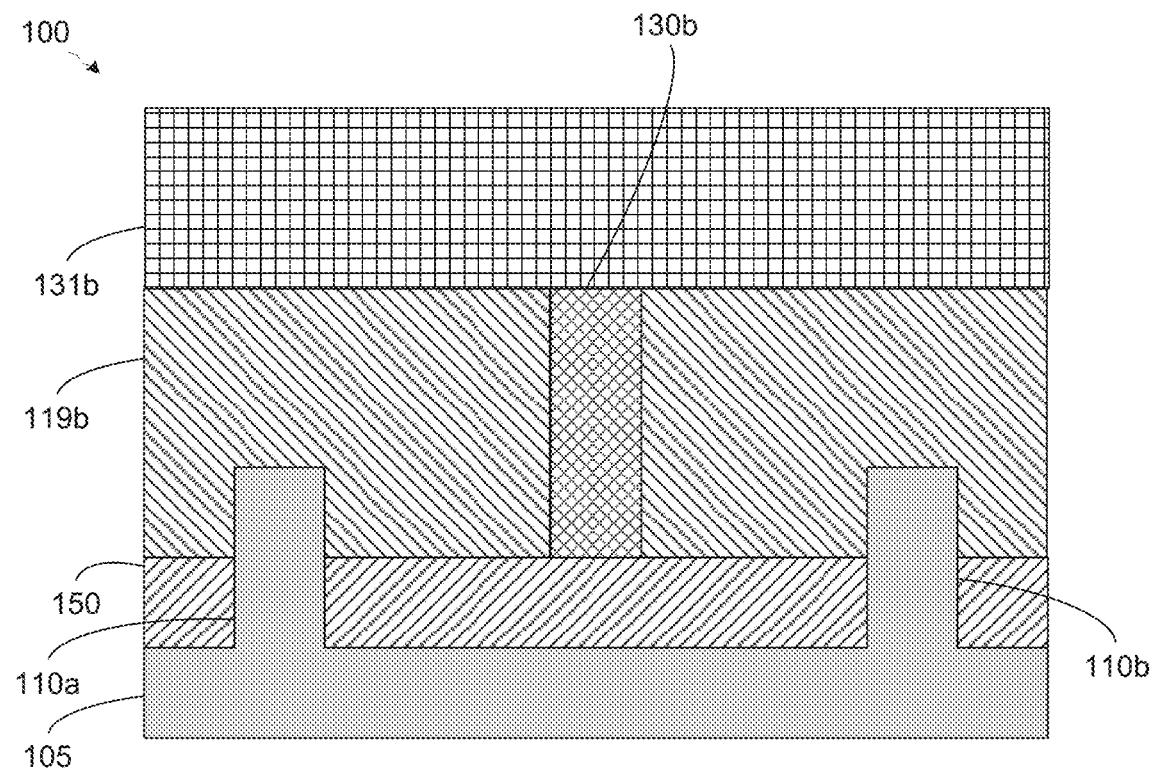
FIG. 9 illustrates a cross-sectional X2 cut view of a semiconductor device after a fourth stage of processing, in accordance with embodiments herein.

FIG. 8 illustrates a cross-sectional X1 cut view and FIG. 9 illustrates a cross-sectional X2 cut view of the semiconductor device 100 after a fourth stage of processing, in accordance with embodiments herein. In the fourth stage of processing, the second dummy gate 119b and the second dielectric body 130b are masked by a mask 131b. In one embodiment, the mask 131b may be a reverse CT mask. Formation of the mask 131b will be a routine matter for the person of ordinary skill in the art having the benefit of the present disclosure. The first dummy gate 119a and the first dielectric body 130a remain exposed after the fourth stage of processing.

Figure 10:
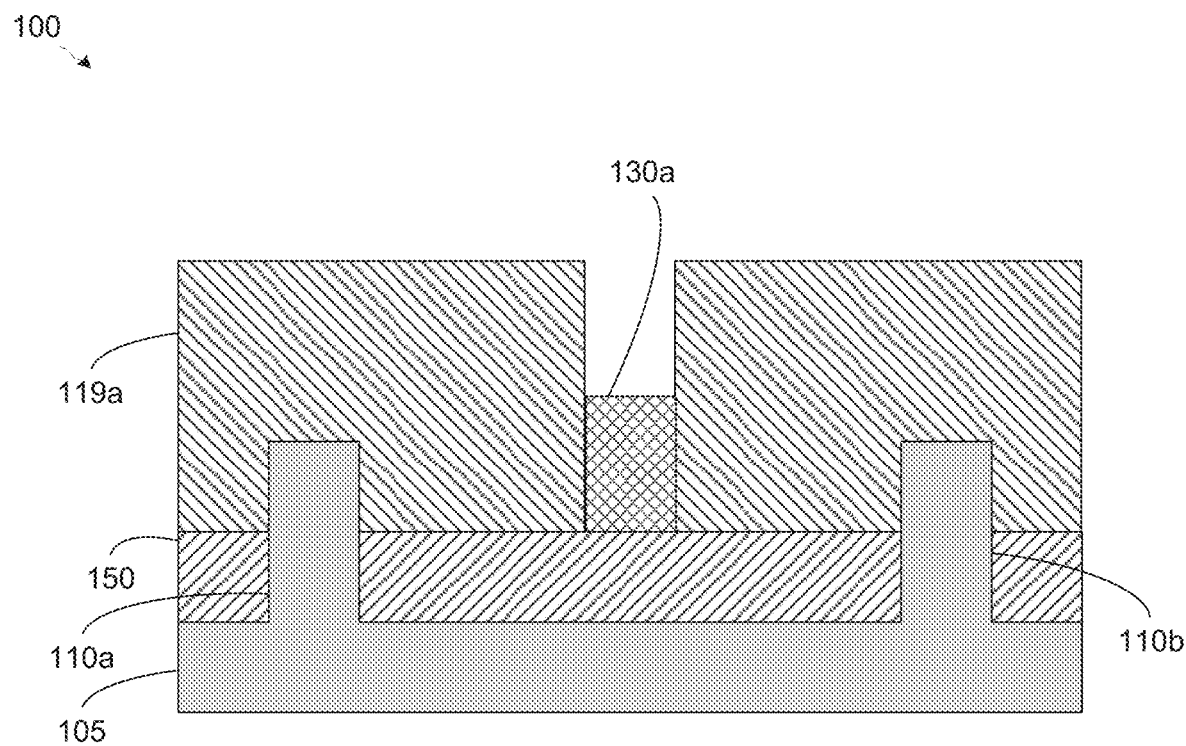
FIG. 10 illustrates a cross-sectional X1 cut view of a semiconductor device after a fifth stage of processing, in accordance with embodiments herein.
Figure 11:
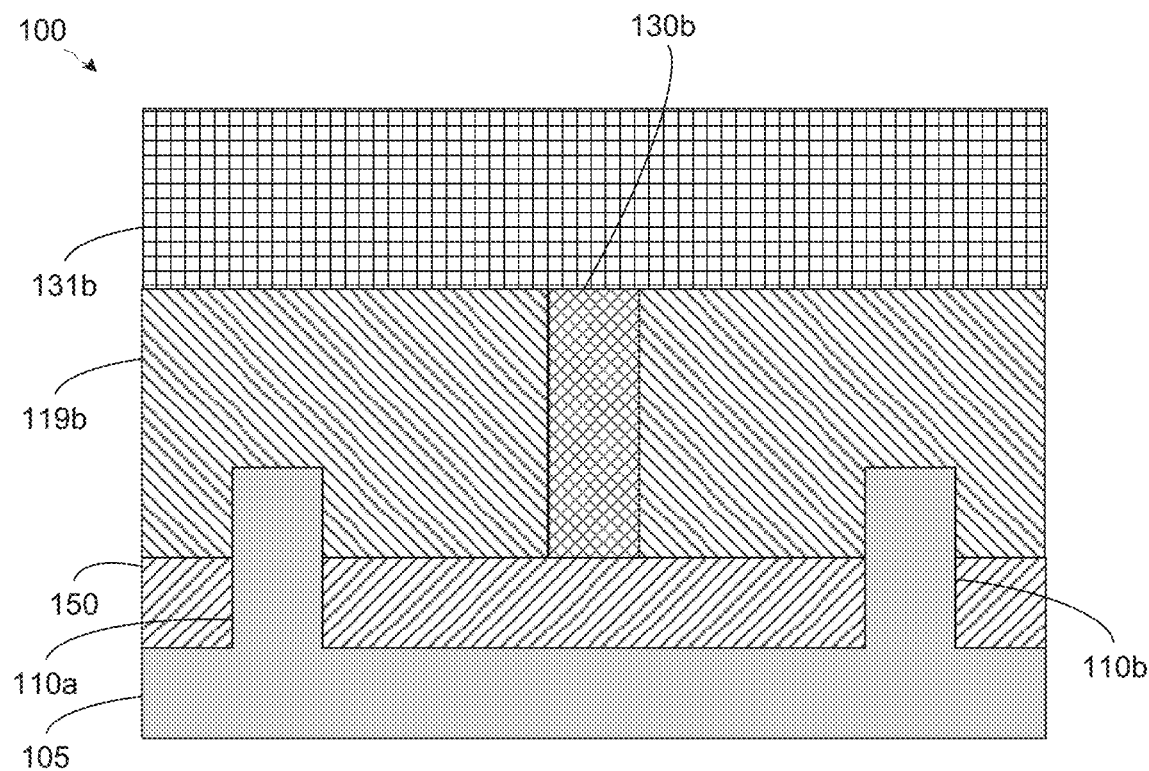
FIG. 11 illustrates a cross-sectional X2 cut view of a semiconductor device after a fifth stage of processing, in accordance with embodiments herein.

FIG. 10 illustrates a cross-sectional X1 cut view and FIG. 11 illustrates a cross-sectional X2 cut view of a semiconductor device after a fifth stage of processing, in accordance with embodiments herein. In the fifth stage of processing, the first dielectric body 130a is recessed, such that the top of the first dielectric body 130a is brought below the top of the first dummy gate 119a. The top of the first dielectric body 130a may be recessed to a position above the tops of the first fin 110a and the second fin 110b. Techniques for recessing dielectric materials selective to dummy gate materials are known and need not be described in detail. The presence of the mask 131b prevents recession of the second dielectric body 130b.

Figure 12:
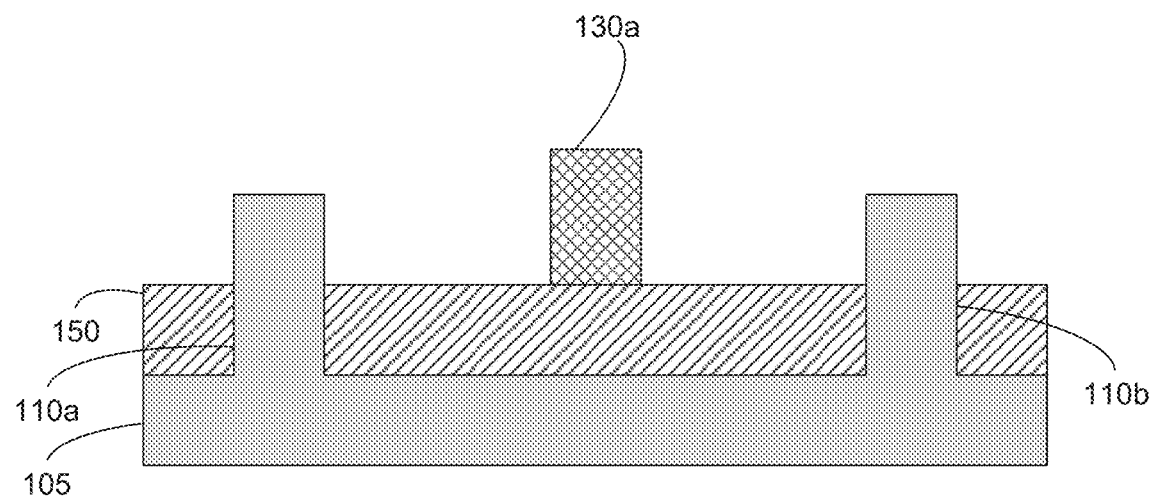
FIG. 12 illustrates a cross-sectional X1 cut view of a semiconductor device after a sixth stage of processing, in accordance with embodiments herein.
Figure 13:
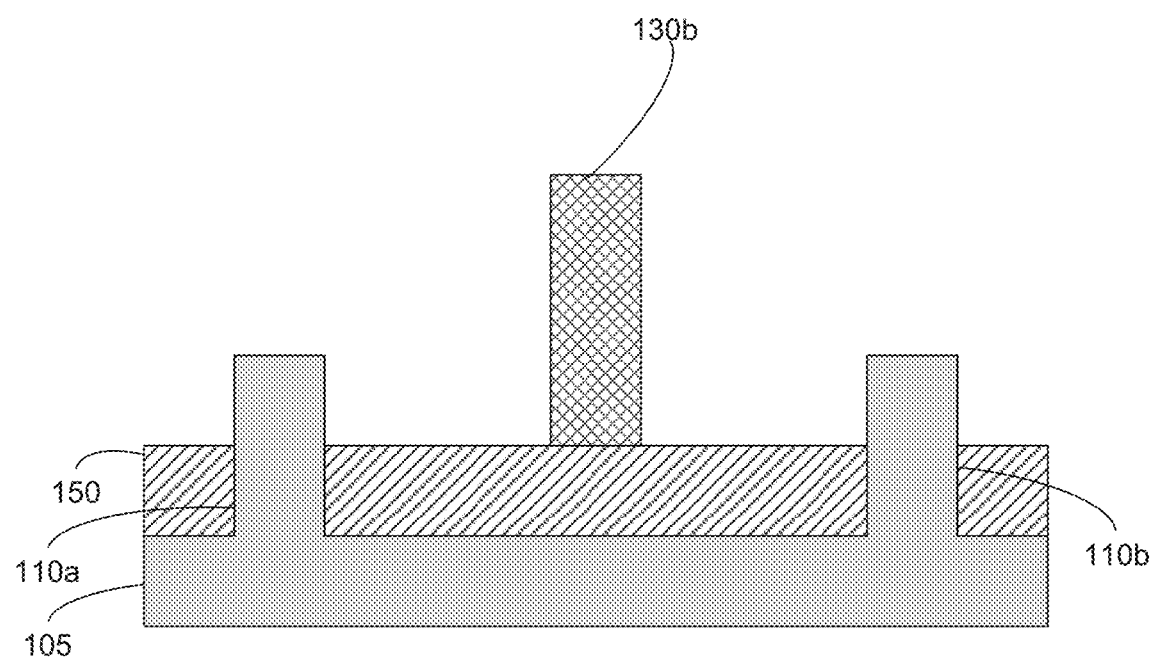
FIG. 13 illustrates a cross-sectional X2 cut view of a semiconductor device after a sixth stage of processing, in accordance with embodiments herein.

FIG. 12 illustrates a cross-sectional X1 cut view and FIG. 13 illustrates a cross-sectional X2 cut view of a semiconductor device after a sixth stage of processing, in accordance with embodiments herein. In the sixth stage of processing, the mask 131b is removed from the second dummy gate 119b, and subsequently, both dummy gates 119a and 119b are removed. Mask and dummy gate removal techniques will be known to the person of ordinary skill in the art and need not be described further.

Figure 14:
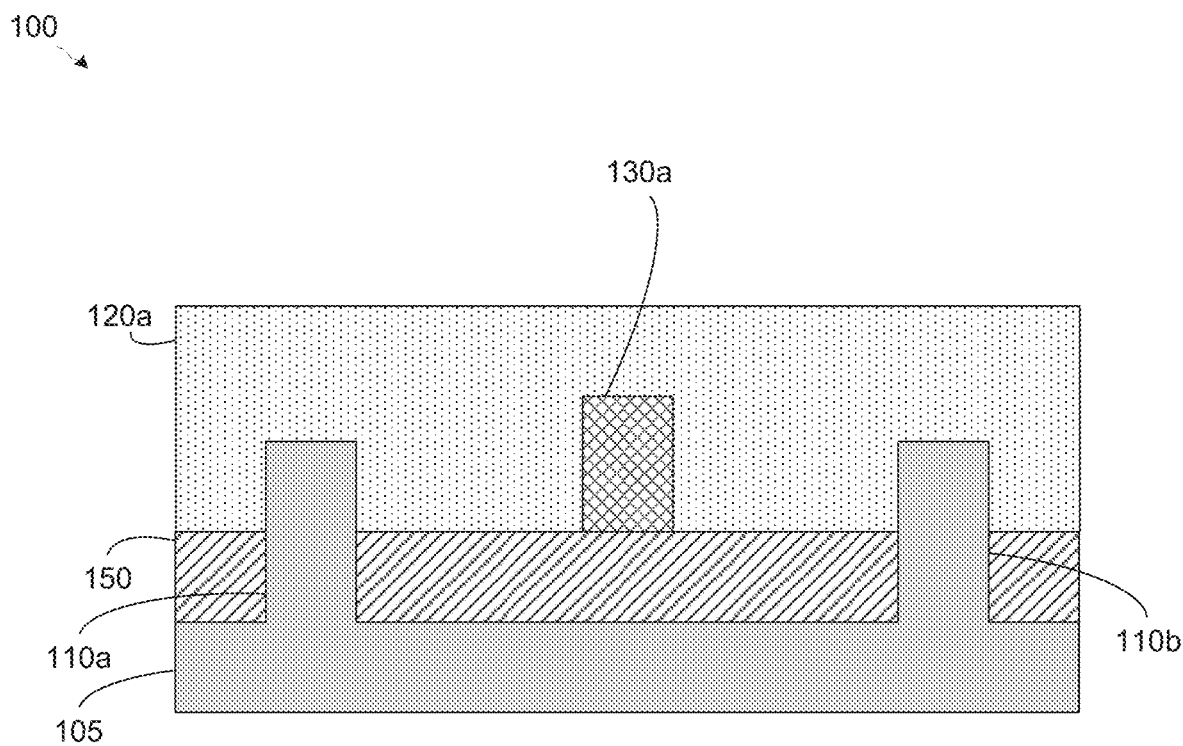
FIG. 14 illustrates a cross-sectional X1 cut view of a semiconductor device after a seventh stage of processing, in accordance with embodiments herein.
Figure 15:
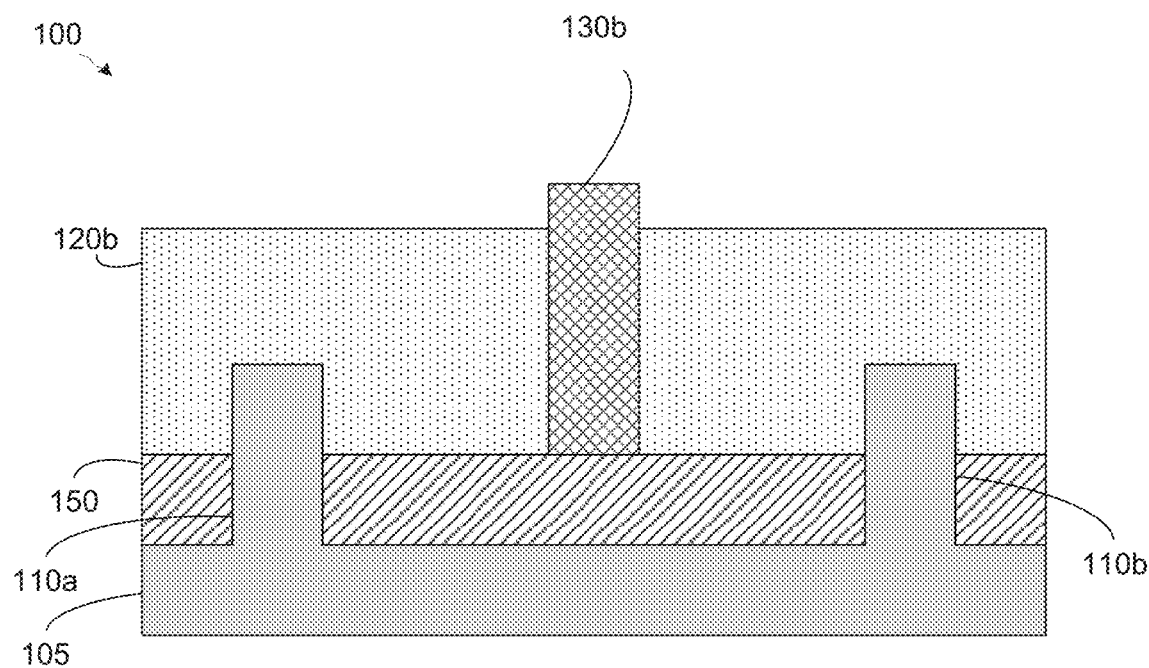
FIG. 15 illustrates a cross-sectional X2 cut view of a semiconductor device after a seventh stage of processing, in accordance with embodiments herein.

FIG. 14 illustrates a cross-sectional X1 cut view and FIG. 15 illustrates a cross-sectional X2 cut view of a semiconductor device after a seventh stage of processing, in accordance with embodiments herein. In the seventh stage of processing, a first metal gate 120a and a second metal gate 120b are formed, such as by the use of known techniques. The first metal gate 120a is formed such that its top is above the top of the first dielectric body 130a. The second metal gate 120b is formed such that its top is at or below the top of the second dielectric body 130b. For example, as shown in FIG. 15, the top of the second metal gate 120b may be below the top of the second dielectric body 130b.

Figure 16:
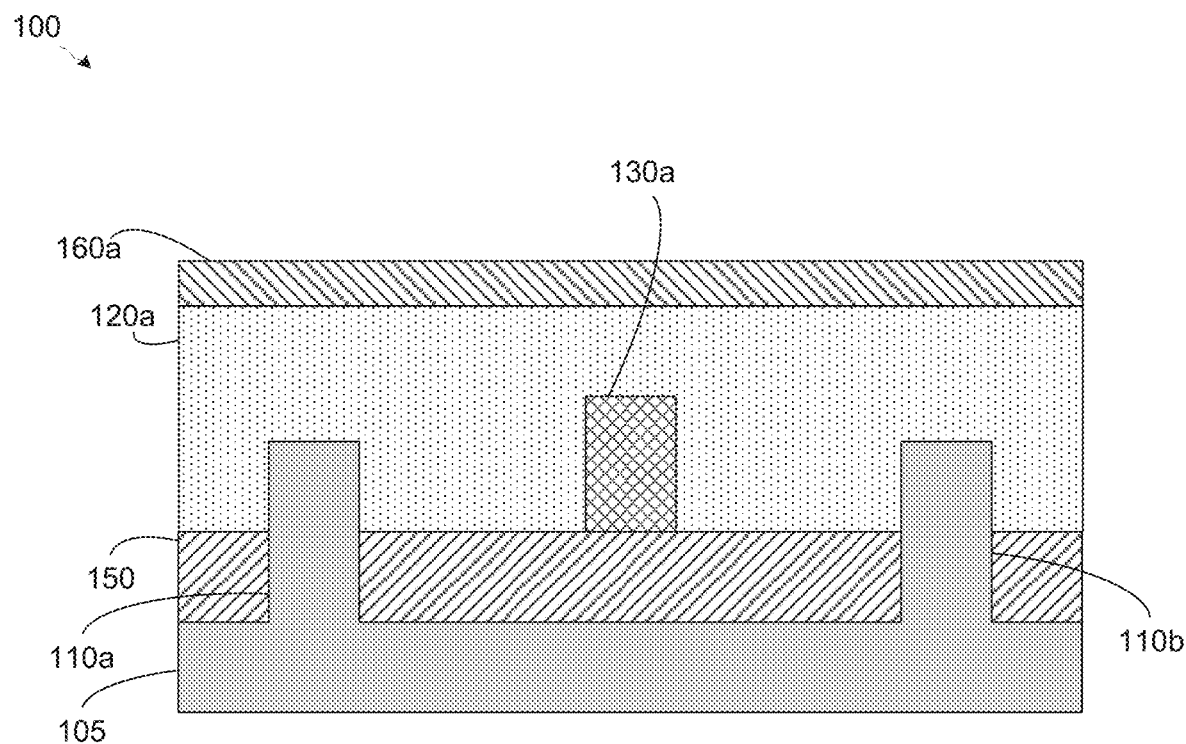
FIG. 16 illustrates a cross-sectional X1 cut view of a semiconductor device after an eighth stage of processing, in accordance with embodiments herein.
Figure 17:
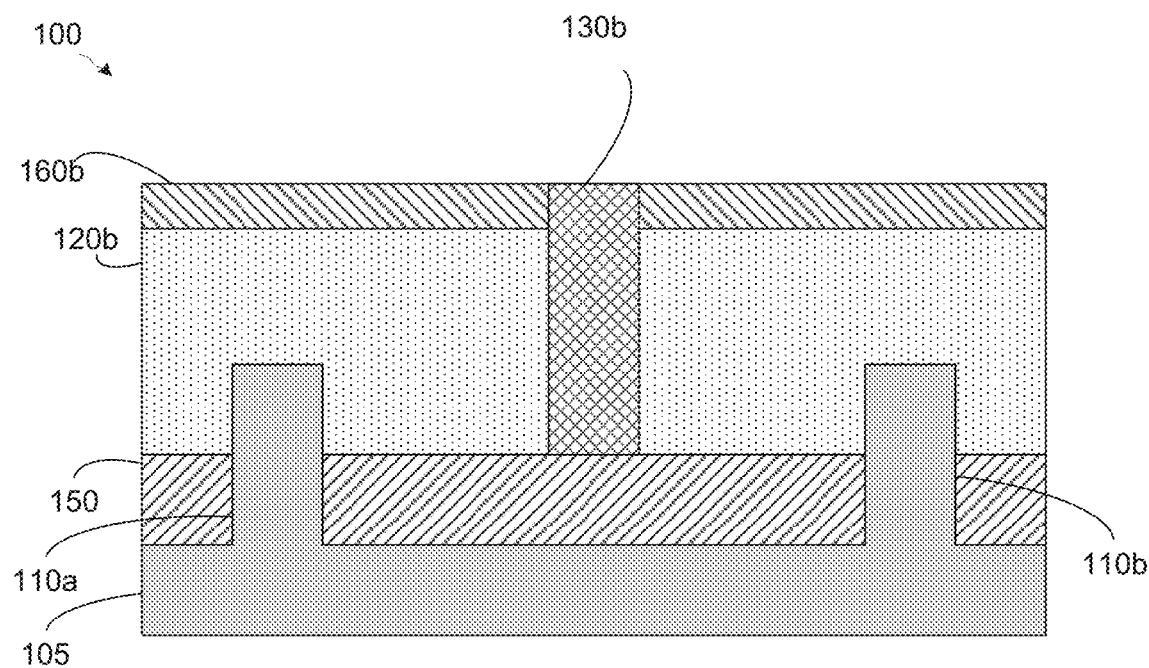
FIG. 17 illustrates a cross-sectional X2 cut view of a semiconductor device after an eighth stage of processing, in accordance with embodiments herein.

FIG. 16 illustrates a cross-sectional X1 cut view and FIG. 17 illustrates a cross-sectional X2 cut view of a semiconductor device after an eighth stage of processing, in accordance with embodiments herein. In the eighth stage of processing, a first self-aligned cap (SAC) 160a and a second SAC 160b are formed over the first metal gate 120a and the second metal gate 120b, respectively. SAC formation will be a routine matter for the person of ordinary skill in the art having the benefit of the present disclosure.

Figure 18:
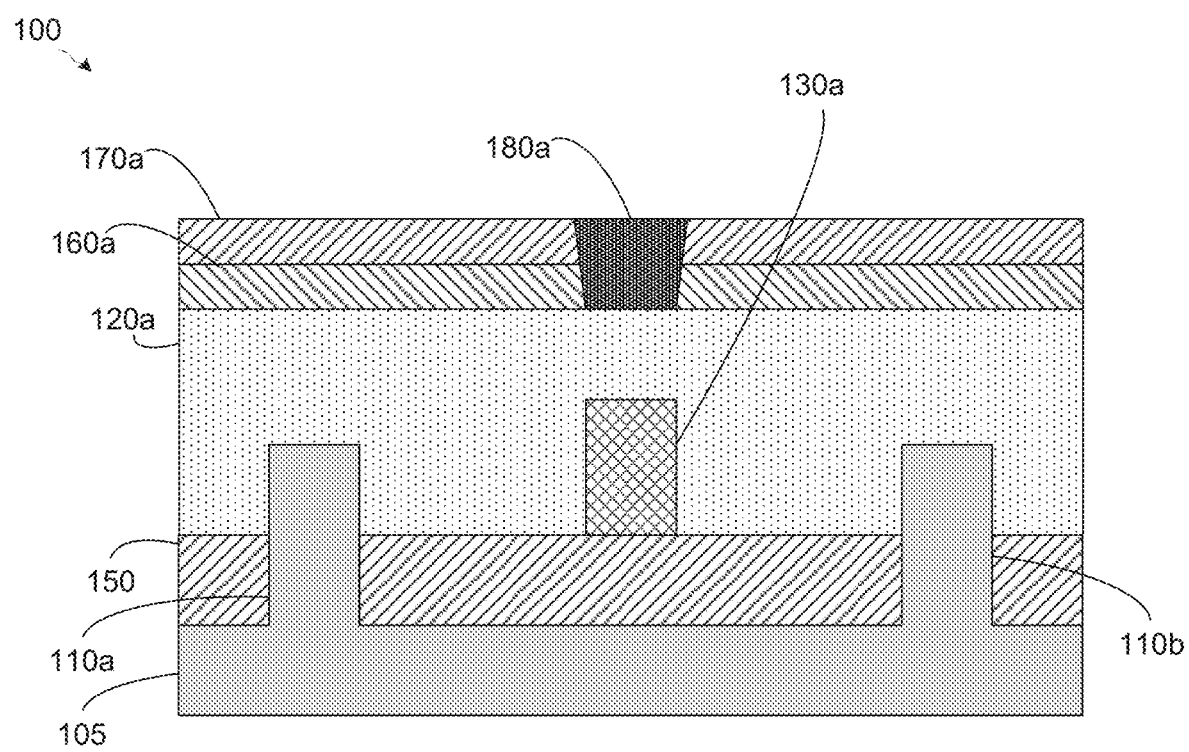
FIG. 18 illustrates a cross-sectional X1 cut view of a semiconductor device after a ninth stage of processing, in accordance with embodiments herein.

FIG. 18 illustrates a cross-sectional X1 cut view of a semiconductor device after a ninth stage of processing, in accordance with embodiments herein. In the ninth stage of processing, a first oxide layer 170a may be formed on the first SACs 160a. (Similarly, though not shown for brevity, a second oxide layer may be formed on the second SAC 160b). Subsequently, a first gate contact 180a may be formed by forming a trench in the first oxide layer 170a and the first SAC 160a, thereby exposing a portion of the top of the first metal gate 120a. Desirably, the first gate contact 180a is formed directly over the first dielectric body 130a. Oxide layer formation and gate contact formation may be performed following known techniques and need not be described further.

The presence of the first dielectric body 130a directly below the first gate contact 180a may reduce parasitic capacitance between the first metal gate 120a and the first S/D contact 140a shown in FIG. 1.

After the ninth stage of processing, other, conventional process steps (not shown) may be performed on the semiconductor device 100 to yield a final semiconductor device 100 suitable for one or more desired end uses.

Figure 19:
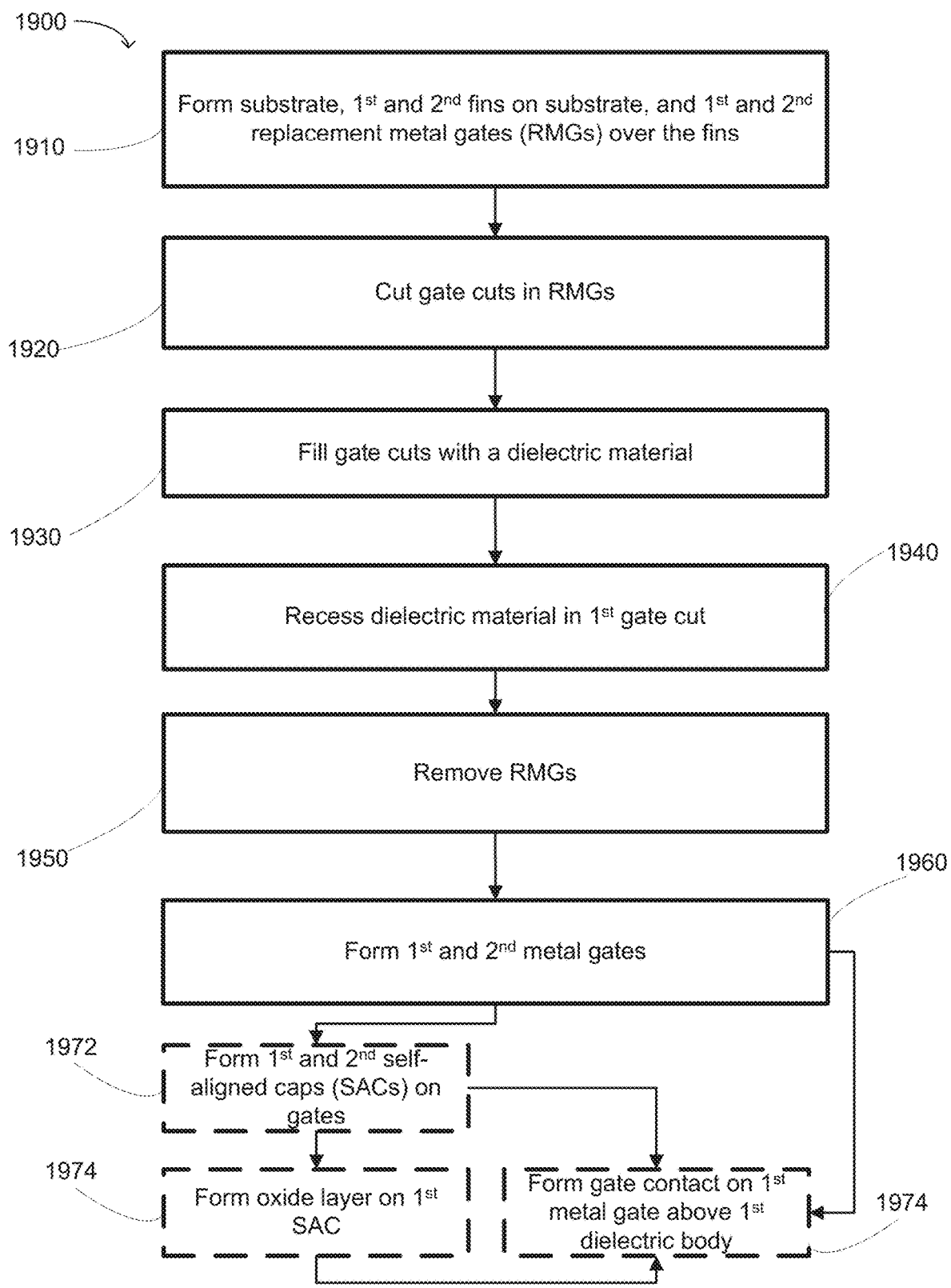
FIG. 19 illustrates a flowchart depiction of process steps of providing a semiconductor device, in accordance with embodiments herein.

Turning to FIG. 19, we illustrate a flowchart depiction of process steps of providing a semiconductor device, in accordance with embodiments herein. The process 1900 may include forming (at 1910) a semiconductor substrate; a first fin and a second fin on the semiconductor substrate, wherein each fin has a long axis extending in a first horizontal direction; an isolation structure on the substrate between the first fin and the second fin; a first replacement metal gate (RMG) and a second RMG on the substrate, the first fin, and the second fin, wherein each RMG has a long axis extending in a second horizontal direction perpendicular to the first horizontal direction.

In one embodiment, the first fin and the second fin may comprise the same material as the semiconductor substrate. Alternatively, the first fin and the second fin may each comprise a plurality of semiconductor layers interleaved with a plurality of metal layers.

The process 1900 may also include cutting (at 1920) a first gate cut in the first RMG and a second gate cut in the second RMG, wherein both gate cuts are to the isolation structure between the first fin and the second fin. The process 1900 may further include filling (at 1930) the first gate cut and the second gate cut with a dielectric material. In one embodiment, the dielectric material comprises silicon nitride.

The process 1900 may further comprise recessing (at 1940) the dielectric material in the first gate cut, to yield a first dielectric body and a second dielectric body, wherein a top of the first dielectric body is below a top of the first RMG. Subsequently, the process 1900 may additionally comprise removing (at 1950) the first RMG and the second RMG. The process 1900 may yet further comprise forming (at 1960) a first metal gate over the first dielectric body, wherein a top of the first metal gate is above the top of the first dielectric body; and a second metal gate adjacent to the second dielectric body, wherein a top of the second metal gate is at or below the top of the second dielectric body.

In one embodiment, the process 1900 may additionally comprise forming (at 1972) a first self-aligned cap (SAC) over the first gate and a second SAC over the second gate, wherein the top of the second dielectric body is at a top of the second SAC.

Alternatively or in addition, the process 1900 may further comprise forming (at 1974) an oxide layer on the first SAC.

Also alternatively or in addition, the process 1900 may further comprise forming (at 1974) a gate contact on the first metal gate above the first dielectric body.

Figure 20:
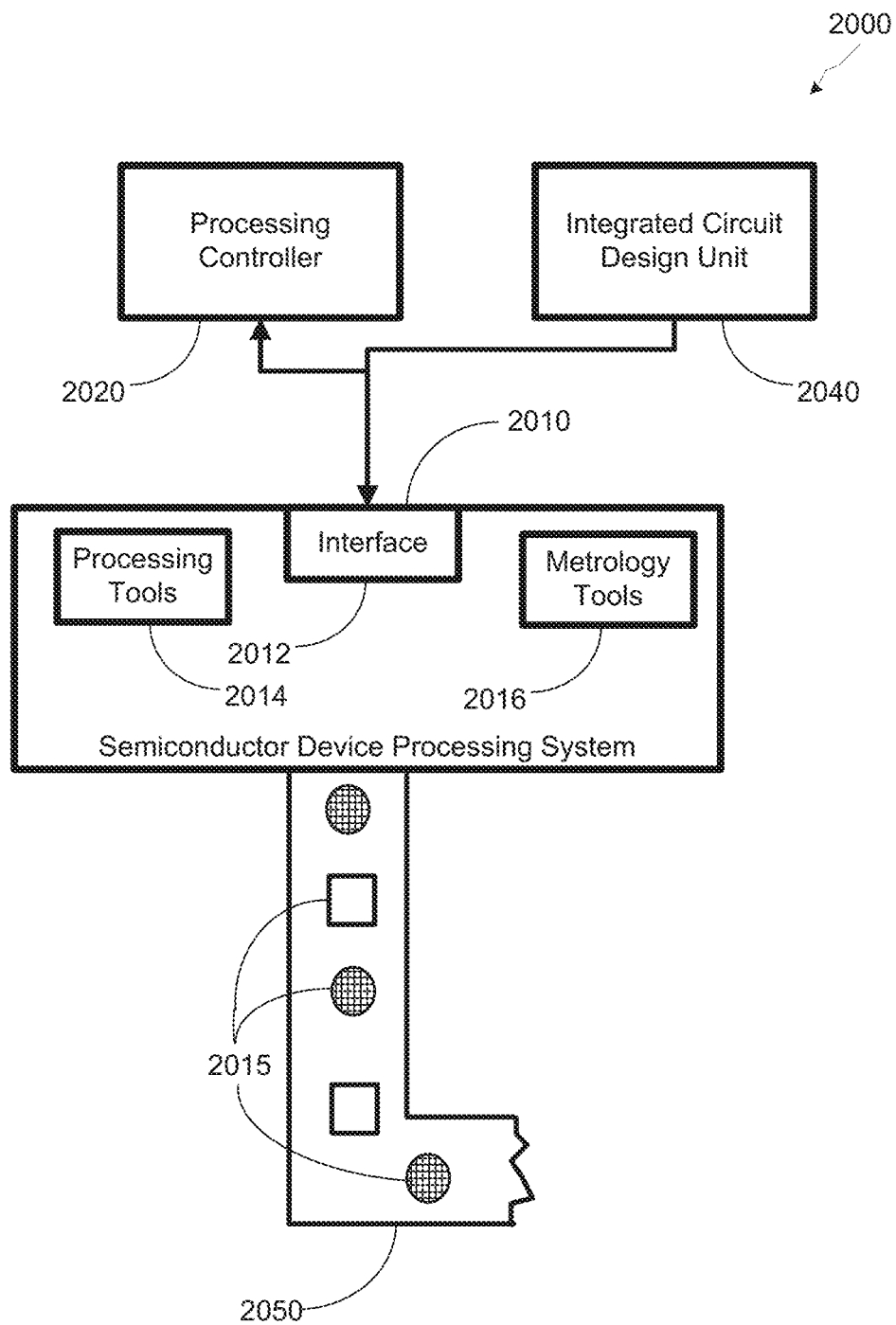
FIG. 20 illustrates a stylized depiction of a system for fabricating a semiconductor device, in accordance with embodiments herein.

Turning now to FIG. 20, a stylized depiction of a system 2000 for fabricating a semiconductor device, in accordance with embodiments herein, is illustrated. A system 2000 of FIG. 20 may include a semiconductor device processing system 2010 and an integrated circuit design unit 2040. The semiconductor device processing system 2010 may manufacture integrated circuit devices based upon one or more designs provided by the integrated circuit design unit 2040. The system 2000 is capable of performing at least one of the process steps described in relation to FIGS. 2-18. The semiconductor device processing system 2010 is capable of implementing the process described in the flowchart of FIG. 19.

The semiconductor device processing system 2010 may include various processing stations, such as etch process stations, photolithography process stations, CMP process stations, etc. Each of the processing stations may include one or more processing tools 2014 and or metrology tools 2016. Feedback based on data from the metrology tools 2016 may be used to modify one or more process parameters used by the processing tools 2014 for performing process steps.

The semiconductor device processing system 2010 may also include an interface 2012 that is capable of providing communications between the processing tools 2014, the metrology tools 2016, and a controller, such as the processing controller 2020. One or more of the processing steps performed by the semiconductor device processing system 2010 may be controlled by the processing controller 2020. The processing controller 2020 may be a workstation computer, a desktop computer, a laptop computer, a tablet computer, or any other type of computing device including one or more software products that are capable of controlling processes, receiving process feedback, receiving test results data, performing learning cycle adjustments, performing process adjustments, etc.

The semiconductor device processing system 2010 may produce integrated circuits on a medium, such as silicon wafers. In one embodiment, the semiconductor device processing system 2010 may produce integrated circuits having semiconductor devices 100.

The production of integrated circuits by the semiconductor device processing system 2010 may be based upon the circuit designs provided by the integrated circuits integrated circuit design unit 2040. The semiconductor device processing system 2010 may provide processed integrated circuits/devices 2015 on a transport mechanism 2050, such as a conveyor system. In some embodiments, the conveyor system may be sophisticated clean room transport systems that are capable of transporting semiconductor wafers. In one embodiment, the semiconductor device processing system 2010 may include a plurality of processing steps, e.g., the 1$^{st}$ process step, the 2$^{nd}$ process step, etc., as described above.

In some embodiments, the items labeled "2015" may represent individual wafers, and in other embodiments, the items 2015 may represent a group of semiconductor wafers, e.g., a "lot" of semiconductor wafers.

The integrated circuit design unit 2040 of the system 2000 is capable of providing a circuit design that may be manufactured by the semiconductor device processing system 2010. This may include information regarding the components of the semiconductor device 100 described above. For example, this information may include the positions and/or dimensions of the first fin 110$a$, the second fin 110$b$, the first gate 120$a$, the second gate 120$b$, the first dielectric body 130$a$, and the second dielectric body 130$b$, among other components. These positions and/or dimensions may be based upon data relating to drive currents/performance metrics, device dimensions, maximum tolerable parasitic capacitance, etc. The integrated circuit design unit 2040 may be capable of determining the number of devices (e.g., processors, memory devices, etc.) to place in a device package. Based upon such details of the devices, the integrated circuit design unit 2040 may determine specifications of the semiconductor devices 100 that are to be manufactured. Based upon these specifications, the integrated circuit design unit 2040 may provide data for manufacturing a semiconductor device 100 described herein.

The system 2000 may be capable of performing analysis and manufacturing of various products involving various technologies. For example, the system 2000 may receive design and production data for manufacturing devices of CMOS technology, Flash technology, BiCMOS technology, power devices, memory devices (e.g., DRAM devices), NAND memory devices, and/or various other semiconductor technologies. This data may be used by the system 2000 to fabricate the semiconductor devices 100 described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
   a semiconductor substrate;
   a first fin and a second fin on the semiconductor substrate, wherein each fin has a long axis extending in a first horizontal direction;
   an isolation structure on the substrate between the first fin and the second fin;
   a first metal gate and a second metal gate on the substrate, the first fin, and the second fin, wherein each metal gate has a long axis extending in a second horizontal direction perpendicular to the first horizontal direction;
   a first dielectric body under the first metal gate, neither under nor in the second metal gate, and on the isolation structure between the first fin and the second fin, wherein a top of the first dielectric body is below a top of the first metal gate; and
   a second dielectric body in the second metal gate, neither in nor under the first metal gate, and on the isolation structure between the first fin and the second fin, wherein a top of the second dielectric body is at or above a top of the second metal gate.

2. The semiconductor device of claim 1, wherein the top of the first dielectric body is above a top of the first fin and above a top of the second fin.

3. The semiconductor device of claim 1, further comprising a first self-aligned cap (SAC) over the first gate and a second SAC over the second gate, wherein the top of the second dielectric body is at a top of the second SAC.

4. The semiconductor device of claim 3, further comprising an oxide layer on the first SAC.

5. The semiconductor device of claim 1, wherein the first dielectric body and the second dielectric body comprise silicon nitride.

6. The semiconductor device of claim 1, further comprising a gate contact on the first metal gate above the first dielectric body.

7. The semiconductor device of claim 1, wherein the first fin and the second fin comprise the same material as the semiconductor substrate.

8. The semiconductor device of claim 1, wherein the first fin and the second fin comprise a plurality of semiconductor layers interleaved with a plurality of metal layers.

* * * * *